(12) United States Patent
Jia et al.

(10) Patent No.: US 11,925,074 B2
(45) Date of Patent: Mar. 5, 2024

(54) DISPLAY PANEL AND ELECTRONIC APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Li Jia, Beijing (CN); Tao Gao, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 235 days.

(21) Appl. No.: 17/473,170

(22) Filed: Sep. 13, 2021

(65) Prior Publication Data
US 2022/0093711 A1 Mar. 24, 2022

(30) Foreign Application Priority Data

Sep. 18, 2020 (CN) .......................... 202010989867.X

(51) Int. Cl.
| | |
|---|---|
| *H10K 59/123* | (2023.01) |
| *H10K 59/121* | (2023.01) |
| *H10K 59/124* | (2023.01) |
| *H10K 71/00* | (2023.01) |

(Continued)

(52) U.S. Cl.
CPC ....... *H10K 59/123* (2023.02); *H10K 59/1213* (2023.02); *H10K 59/124* (2023.02); *H10K 71/00* (2023.02); *H01L 27/1214* (2013.01); *H10K 59/1201* (2023.02)

(58) Field of Classification Search
CPC ............ H01L 27/1214–1296; H10K 59/10–65
See application file for complete search history.

(56) References Cited

U.S. PATENT DOCUMENTS

| | | | | |
|---|---|---|---|---|
| 11,374,075 | B2 * | 6/2022 | Wu ....................... | H10K 59/124 |
| 2005/0079721 | A1 * | 4/2005 | Buerger ................. | H10B 10/15 |
| | | | | 257/E27.005 |

(Continued)

FOREIGN PATENT DOCUMENTS

| | | | | |
|---|---|---|---|---|
| CN | 110767700 | | 2/2020 | |
| CN | 111092109 A | * | 5/2020 | ......... H01L 27/3246 |
| CN | 111326560 | | 6/2020 | |

OTHER PUBLICATIONS

Machine translation of CN 111092109 A (Year: 2020).*

(Continued)

*Primary Examiner* — Bryan R Junge
(74) *Attorney, Agent, or Firm* — Dority & Manning, P.A.

(57) ABSTRACT

A display panel has an active area, and the active area has a camera region. The display panel includes a base, an insulating layer, and a plurality of transparent wirings. The insulating layer is disposed on the base. The insulating layer is provided with a plurality of first grooves located in the camera region. An included angle between a groove wall of a first groove and a surface on which an opening of the first groove is located is less than 90 degrees. The plurality of transparent wirings are disposed on groove walls of the plurality of first grooves.

17 Claims, 9 Drawing Sheets

(51) Int. Cl.
*H01L 27/12* (2006.01)
*H10K 59/12* (2023.01)

(56) References Cited

U.S. PATENT DOCUMENTS

| | | | | |
|---|---|---|---|---|
| 2007/0105308 | A1* | 5/2007 | Hosaka | H10B 43/30 |
| | | | | 438/257 |
| 2010/0240185 | A1* | 9/2010 | Sohn | H01L 29/66666 |
| | | | | 438/270 |
| 2018/0102382 | A1* | 4/2018 | Peng | H01L 27/1248 |
| 2020/0212368 | A1 | 7/2020 | Tang et al. | |
| 2021/0408191 | A1* | 12/2021 | Zhao | H10K 59/123 |

OTHER PUBLICATIONS

Chinese Notification to Grant Patent Right for Invention (w/ English translation) for corresponding CN Application No. 202010989867.X, 14 pages.

* cited by examiner

DISPLAY PANEL AND ELECTRONIC APPARATUS

CROSS-REFERENCE TO RELATED APPLICATION

This application claims priority to Chinese Patent Application No. 202010989867.X, filed on Sep. 18, 2020, which is incorporated herein by reference in its entirety.

TECHNICAL FIELD

The present disclosure relates to the field of display technologies, and in particular, to a display panel and an electronic apparatus.

BACKGROUND

With development of display technologies, people are increasingly paying attention to appearance of mobile terminals. A large-screen terminal with a relatively large screen-to-body ratio has gradually become one of the mainstream designs of mobile terminals. The large-screen terminal can enhance the user's gaming and entertainment experience and is conducive to a split-screen display, and a whole body has a relatively high sense of technology, which can bring a strong visual impact to the user. A full-screen display apparatus is a large-screen terminal. For example, a display apparatus with an under-screen camera has characteristics of little impact on a visual image of the display apparatus and relatively high screen-to-body ratio since the camera thereof is disposed under a display panel of the display apparatus, and has become a potential display apparatus design at present.

SUMMARY

In one aspect, a display panel is provided. The display panel has an active area, and the active area has a camera region. The display panel includes a base, an insulating layer, and a plurality of transparent wirings. The insulating layer is disposed on the base. The insulating layer is provided with a plurality of first grooves located in the camera region. An included angle between a groove wall of a first groove and a surface on which an opening of the first groove is located is less than 90 degrees. The plurality of transparent wirings are disposed on groove walls of the plurality of first grooves.

In some embodiments, the included angle between the groove wall of the first groove and the surface on which the opening of the first groove is located is in a range of 20 to 80 degrees, inclusive.

In some embodiments, the plurality of first grooves are in a same shape.

In some embodiments, on a plane perpendicular to the base and an extending direction of the first groove, a cross-sectional shape of the first groove is an inverted trapezoid or a triangle.

In some embodiments, among the plurality of first grooves, cross-sectional shapes of a part of first grooves are inverted trapezoids, and cross-sectional shapes of another part of first grooves are triangles.

In some embodiments, the display panel further includes gate lines, and an extending direction of the first groove is parallel with an extending direction of the gate lines.

In some embodiments, the display panel further includes data lines, and the extending direction of the first groove is parallel with an extending direction of the data lines.

In some embodiments, the display panel further includes first light-emitting devices located in the camera region, the groove wall of the first groove is disposed under each line of first light-emitting devices parallel with an extending direction of the first groove.

In some embodiments, lines of first light-emitting devices parallel with the extending direction of the first groove are in a one-to-one correspondence with the groove walls of the first grooves.

In some embodiments, the plurality of transparent wirings are made of indium tin oxide.

In some embodiments, the insulating layer is a first planarization layer; and the display panel further includes a second planarization layer disposed on the first planarization layer.

In some embodiments, the display panel further includes first light-emitting devices disposed on the second planarization layer, and a first anode of a first light-emitting device passes through a first through hole in the second planarization layer to be electrically connected to a transparent wiring.

In some embodiments, the insulating layer is an interlayer insulating layer; and the display panel further includes a first planarization layer, and the first planarization layer is disposed on the interlayer insulating layer.

In some embodiments, the display panel further includes first light-emitting devices disposed on the first planarization layer, and a first anode of a first light-emitting device passes through a second through hole in the first planarization layer to be electrically connected to a transparent wiring.

In some embodiments, the display panel further includes driving circuits located in the active area and outside the camera region, and a part of driving circuits are electrically connected to first anodes of the first light-emitting devices through the plurality of transparent wirings.

In some embodiments, the display panel further includes second light-emitting devices located in the active area and outside the camera region, the second light-emitting devices are disposed on the first planarization layer, and a second anode of a second light-emitting device passes through a third through hole in the first planarization layer to be electrically connected to a driving circuit.

In some embodiments, each driving circuit includes a gate, and the gate is disposed on the interlayer insulating layer.

In some embodiments, each driving circuit includes an active pattern, and the active pattern is disposed on the interlayer insulating layer.

In some embodiments, each driving circuit includes a source-drain electrode layer, and the source-drain electrode layer is disposed on the interlayer insulating layer.

In another aspect, an electronic apparatus is provided. The electronic apparatus includes the display panel as described in any of the above embodiments.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on actual sizes of products, actual processes of methods and actual timings of signals involved in the embodiments of the present disclosure.

DETAILED DESCRIPTION

Figure 1:
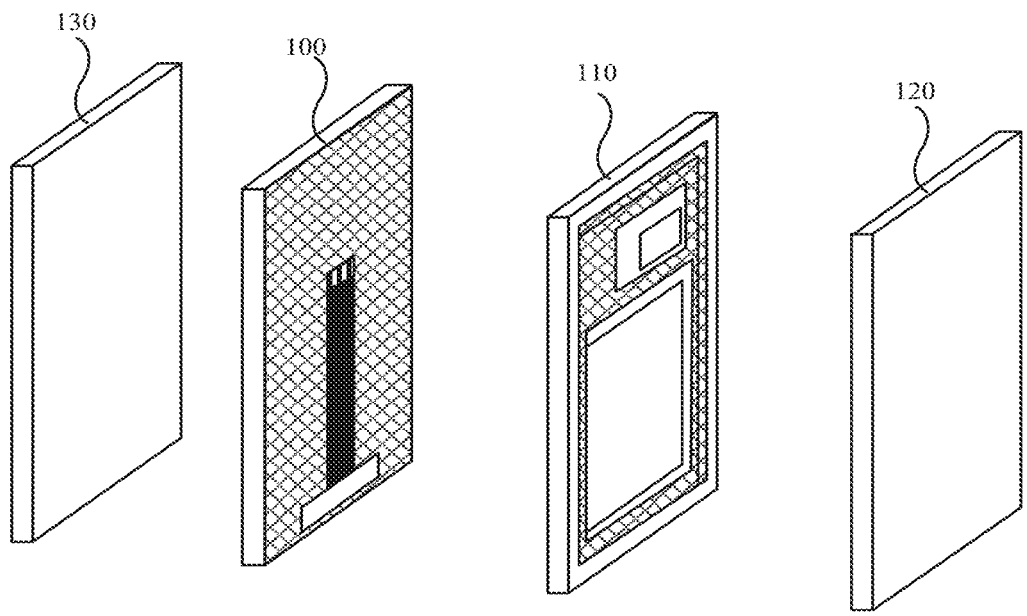
FIG. 1 is a structural diagram of an electronic apparatus, in accordance with some embodiments.

Technical solutions in some embodiments of the present disclosure will be described clearly and completely below with reference to the accompanying drawings. However, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description, the terms such as "one embodiment," "some embodiments," "exemplary embodiments," "example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms such as "first" and "second'" are used for descriptive purposes only, and are not to be construed as indicating or implying the relative importance or implicitly indicating the number of indicated technical features. Thus, features defined as "first" or "second" may explicitly or implicitly include one or more of the features. As used in the description and the claims, the singular forms "a" "an," and "the" may also include plural referents unless the content dearly dictates otherwise. In the description of the embodiments of the present disclosure, the term "a plurality of" "the plurality of" , or "multiple" means two or more unless otherwise specified.

In the description of some embodiments, the terms "coupled" and "connected" and derivatives thereof may be used. For example, the term "connected" may be used in the description of some embodiments to indicate that two or more components are in direct physical contact or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other, The embodiments disclosed herein are not necessarily limited to the contents herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C. The phrase "A and/or B" includes the following three combinations: only A, only B, and a combination of A and B.

The term "about" or "approximately" as used herein includes a stated value and an average value within an acceptable range of deviation of a particular value. The acceptable range of deviation is determined by a person of ordinary skill in the art in consideration of measurement in question and errors associated with the measurement of a particular quantity (i.e., limitations of a measurement system).

Exemplary embodiments are described herein with reference to sectional views and/or plan views as idealized exemplary drawings. In the accompanying drawings, thicknesses of layers and sizes of regions may be exaggerated for clarity. Exemplary embodiments of the present disclosure should not be construed to be limited to shapes of regions shown herein, but to include deviations in shape due to, for example, manufacturing. For example, an etched region shown as a rectangle generally has a curved feature. Therefore, the regions shown in the accompanying drawings are schematic in nature, and their shapes are not intended to show actual shapes of the region in a device, and are not intended to limit the scope of the exemplary embodiments.

In the embodiments of the present disclosure, A being located on B can be understood that B is a carrier of A. Or it can be understood that, according to an order of preparation of layers, B is formed first, and A is formed later. It is not limited to that A is located above B in space. If a placing angle of a device is rotated, although A is not above B in space, A is still carried by B, that is, A is still located on B.

It will be understood that when a layer or element is referred to as being "on" another layer or substrate, it can be directly on the another layer or substrate, or intervening layers may also be present.

The embodiments of the present disclosure provide an electronic apparatus. The electronic apparatus involved in the embodiments of the present disclosure may be, for example, a tablet computer, a mobile phone, an e-reader, a remote control, a personal computer (PC), a notebook computer, a personal digital assistant (FDA), a vehicle-mounted device, a network television, a wearable device, and a television, The embodiments of the present disclosure do not specifically limit a specific form of the electronic apparatus. For convenience of description, the following description will be given by taking an example in which the electronic apparatus is a mobile phone.

In some embodiments provided in the present disclosure, as shown in FIG. 1, the electronic apparatus 1000 includes a display panel 100, a middle frame 110, a housing 120, and a cover plate 130, The display panel 100 and the middle frame 110 are disposed in the housing 120.

The middle frame 110 is located between the display panel 100 and the housing 120, and a surface of the middle frame 110 away from the display panel 100 (a surface facing the housing 120) is used to install internal components such as a battery, a circuit board, a camera, and an antenna.

The cover plate 130 is located on a side of the display panel 100 away from the middle frame 110. The cover plate 130 may be, for example, a cover glass (CG), and the cover glass may have certain toughness, The display panel 100 has a light exit surface capable of displaying images and a back surface opposite to the light exit surface. The middle frame 110 is disposed on a side of the back surface of the display panel 100, and the cover plate 130 is disposed on a side of the light exit surface of the display panel 100.

In some embodiments of the present disclosure, the display panel 100 is an organic light-emitting diode (OLED) display panel, or the display panel 100 may also be a quantum dot light-emitting diode (QLED) display panel. For convenience of description, descriptions will be given below by taking an example in which the display panel 100 is an OLED display panel.

The OLED display panel may have a top-gate structure or a bottom-gate structure. In addition, the OLED display panel may be of a top-emission structure, a bottom-emission structure, or a double-sided structure. The OLED display panel provided by the embodiments of the present disclosure is only an illustration, and is not limited thereto.

Figure 2:
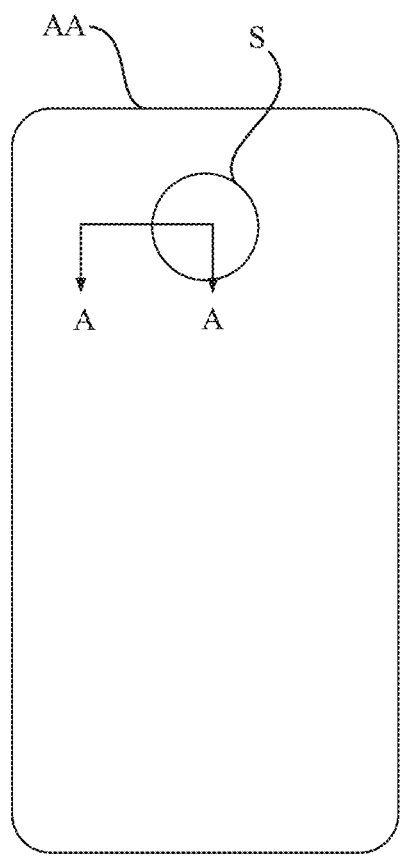
FIG. 2 is a top view of a display panel, in accordance with some embodiments.

It can be seen from a top view of the display panel 100 that, as shown in FIG. 2, the display panel 100 has an active area (AA, also referred to as a display area), and the active area AA has a camera region S. For example, the active area AA has the camera region S and a non-camera region, and the camera region S is surrounded by the non-camera region.

The active area AA is provided with a plurality of sub-pixels capable of emitting light of colors. The colors include at least a first color, a second color, and a third color. The first color, the second color, and the third color are three primary colors (e.g., red, green, and blue). For example, the active area AA may be provided with red sub-pixels R capable of emitting red light, green sub-pixels G capable of emitting green light, and blue sub-pixels B capable of emitting blue light.

Figure 3:
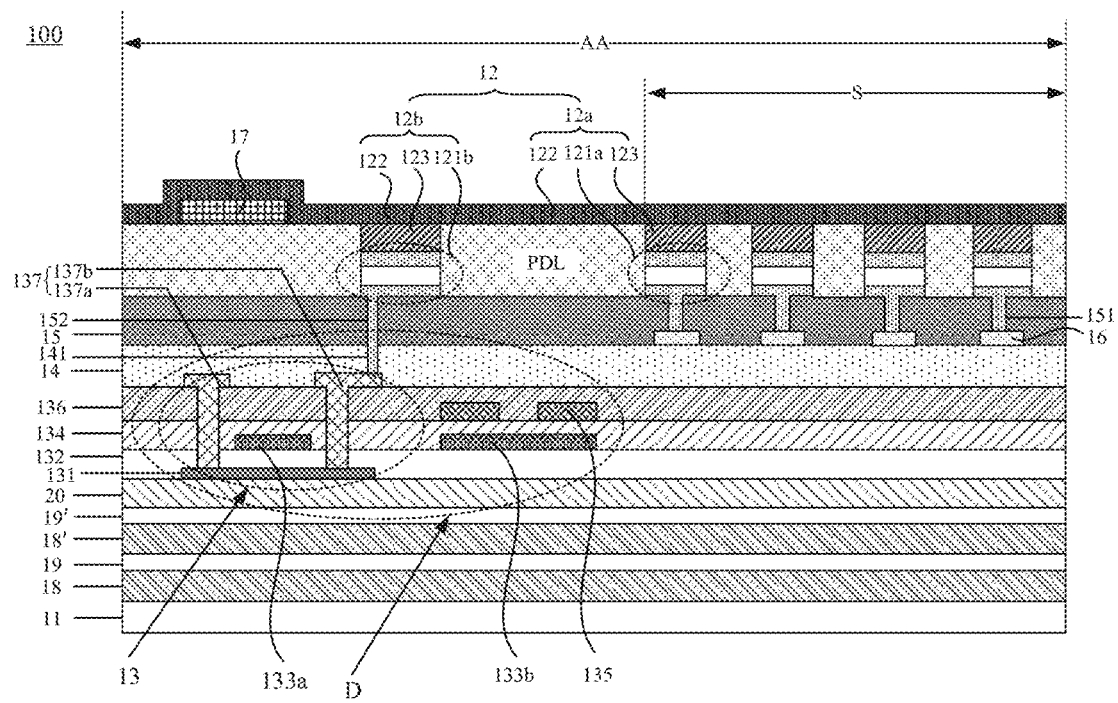
FIG. 3 is a structural diagram of a display panel, in accordance with some embodiments.

It can be seen from a cross-sectional view of the display panel 100 that, as shown in FIG. 3 (a cross-sectional view in the direction A-A in FIG. 2), the display panel 100 includes a base 11, driving circuits D, and light-emitting devices 12. It will be understood that, FIG. 3 only shows one driving circuit D as an example for description.

The base 11 may be made of glass. In this case, the light transmittance of the base 11 is relatively good.

As for the driving circuit D, for example, as shown in FIG. 3, the driving circuit D is disposed on the base 11. The driving circuit D (or referred to as a pixel circuit) is composed of electronic elements such as thin film transistors (TFTs) and at least one capacitor. For example, the driving circuit D may be a pixel circuit of a 2T1C structure composed of two TFTs (one switching TFT and one driving TFT) and one capacitor C. Of course, the driving circuit D may also be composed of more than two TFTs (a plurality of switching TFTs and one driving TFT) and at least one capacitor. The plurality of switching TFTs included in the driving circuit D may be formed synchronously with the driving TFT, and FIG. 3 only illustrates the driving TFT in the driving circuit D.

It will be noted that in the above electronic apparatus 1000, a camera is disposed, corresponding to the camera region S, under the display panel 100 in a direction perpendicular to the light exit surface of the display panel. That is, corresponding to the camera region S, the camera is placed in the middle frame 110 on a side of the base 11 away from the driving circuit D. Light passes through the camera region S of the display panel 100 and enters the camera below the display panel 100.

In order to prevent the driving circuit D from shielding light, in some embodiments, the driving circuit D is not located in the camera region S, which may also be understood that the driving circuit D is located in the active area AA and outside the camera region S in the display panel 100.

That is, as shown in FIG. 3, in the active area AA of the display panel 100, sub-pixels located in the camera region S each include the light-emitting device 12 and do not include the driving circuit D, and sub-pixels located in the non-camera region each include the light-emitting device 12 and the driving circuit D. As for a structure of a thin film transistor 13 in the driving circuit D, for example, as shown in FIG. 3, the thin film transistor 13 includes an active pattern 131, a portion of a first gate insulating layer 132 located in the thin film transistor 13, a gate 133a, a portion of a second gate insulating layer 134 located in the thin film transistor 13, a portion of an interlayer dielectric layer 136 located in the thin film transistor 13, and a source-drain electrode layer 137 including a source 137a and a drain 137b, and they are sequentially stacked on the base 11.

In addition, the driving circuit D further includes a first electrode 133b in a same layer as the gate 133a, and a second electrode 135 located between the second gate insulating layer 134 and the interlayer dielectric layer 136. The first electrode 133b is directly opposite to the second electrode 135, and the first electrode 133b, the second electrode 135 and a portion of the second gate insulating layer 134 located between the first electrode 133b and the second electrode 135 constitute the capacitor in the driving circuit D.

According to different materials of the active pattern 131, the thin film transistor 13 may be an amorphous silicon thin film transistor, a polysilicon thin film transistor, a metal oxide thin film transistor, or an organic thin film transistor, etc. In addition, the thin film transistor 13 may also be of a staggered type, an inverted staggered type, a coplanar type, or an anti-coplanar type, etc. The embodiments of the present disclosure do not limit the materials and specific structures of layers of the thin film transistor, It will be understood that, the display panel 100 further includes a plurality of gate lines for providing scan signals to the driving circuits D, a plurality of data lines for providing data signals to the driving circuits D, and a plurality of power lines for providing power signals (VDD) to the driving circuits D. The plurality of gate lines and the plurality of data lines cross to form the plurality of sub-pixels.

As shown in FIG. 3, the display panel 100 further includes a first planarization layer 14, and the first planarization layer 14 is disposed on a surface of the driving circuit D away from the base 11.

The first planarization layer 14 is made of an insulating organic material, for example, organosiloxane resin. The organosiloxane resin material has a good leveling property, so that the first planarization layer 14 may further improve a flatness of the surface of the driving circuit D.

The first planarization layer 14 is provided with a plurality of third through holes141 The plurality of third through holes 141 are located in the active area AA and outside the camera region S (i.e., in the non-camera region), and are used to form conductive paths for coupling the light-emitting devices 12 in the non-camera region and the thin film transistor 13.

As shown in FIG. 3, the display panel 100 further includes a plurality of transparent wirings 16, the transparent wirings 16 are located on the first planarization layer 14, and each light-emitting device 12 located in the camera region S corresponds to a transparent wiring 16.

Figure 4:
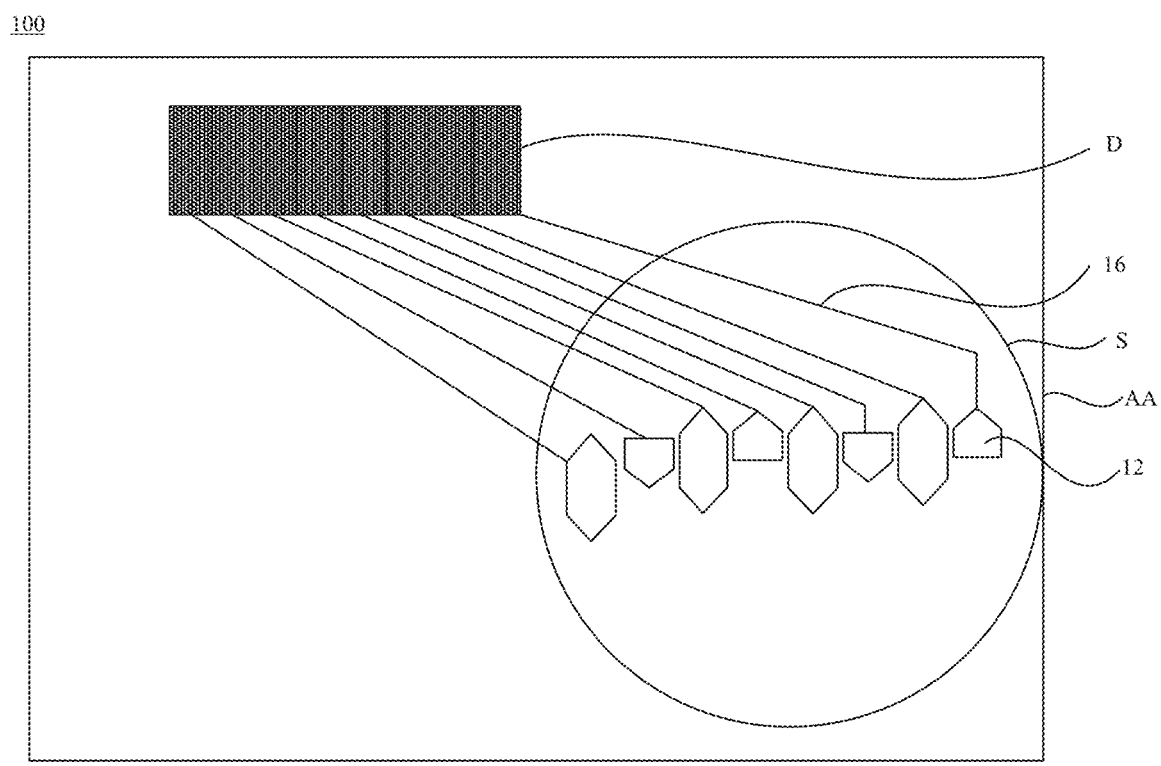
FIG. 4 is a structural diagram of another display panel, in accordance with some embodiments.

As shown in FIG. 4, the driving circuit D is electrically connected to the light-emitting device 12 located in the camera region S through the transparent wiring 16. That is, the light-emitting device 12 located in the camera region S is electrically connected to the transparent wiring 16, and then the transparent wiring 16 is electrically connected to the driving circuit D, so that the driving circuit D may transmit a driving signal to the light-emitting device 12 located in the camera region S. In the embodiment of the present disclosure, since the number of the light-emitting devices 12 located in the camera region S is limited, only part of the driving circuits D are electrically connected to the light emitting devices 12 located in the camera region S through the transparent wirings 16.

In some embodiments, the transparent wiring 16 is made of indium tin oxide (ITO). In this case, a light transmittance of the transparent wiring 16 is approximately 80%, so that the light may pass through the transparent wiring 16 and enter the camera under the display panel 100.

In some embodiments, the plurality of transparent wirings 16 may be prepared by a patterning process (which includes steps of, for example, gluing, exposing, developing, and etching). The etching process may be, for example, a wet etching process.

As shown in FIG. 3, the display panel 100 further includes a second planarization layer 15 disposed on the first planarization layer 14, that is, the second planarization layer 15 is disposed on a surface of the first planarization layer 14 away from the base 11, and the first planarization layer 14 plays a role of supporting the second planarization layer 15.

The second planarization layer 15 is made of an insulating organic material, for example, organosiloxane resin.

The second planarization layer 15 is provided with a plurality of first through holes 151 and a plurality of fourth through holes 152. The plurality of first through holes 151 are located in the camera region S, and the plurality of fourth through holes 152 are located in the active area AA and outside the camera region S (i.e., in the non-camera region). Each fourth through hole 152 communicates with a corresponding third through hole 141, and they are used to form a conductive path for coupling the light-emitting device 12 in the non-camera region and the thin film transistor 13.

Each first through hole 151 is used to form a conductive path for coupling the light-emitting device 12 in the camera region S and the transparent wiring 16.

As for the light-emitting devices 12, for example, as shown in FIG. 3, the light-emitting devices 12 are disposed on the first planarization layer 14.

It will be noted that, for clarity of description, the light-emitting devices 12 are classified into first light-emitting devices 12a located in the camera region S and second light-emitting devices 12b located in the active area AA and outside the camera region S. However, the first light-emitting devices 12a and the second light-emitting devices 12b may be the same (structures, materials, and functions are the same). Of course, the first light-emitting devices 12a and the second light-emitting devices 12b may also be different.

A second light-emitting device 12b includes a second anode 121b, a cathode 122, and a light-emitting material layer 123 disposed between the second anode 121b and the cathode 122. The light-emitting material layer 123 is driven by a driving current between the second anode 121b and the cathode 122 to emit light.

It will be understood that, in each sub-pixel located in the active area AA and outside the camera region S of the display panel 100, a driving circuit D is correspondingly disposed on a side of each second light-emitting device 12b proximate to the base 11.

The second anode 121b of the second light-emitting device 12b passes through the fourth through hole 152 in the second planarization layer 15 and the third through hole 141 in the first planarization layer 14 to be electrically connected to the driving circuit D. The driving circuit D is used to transmit the driving signal to the second anode 121b of the second light-emitting device 12b, and the cathode 122 of the second light-emitting device 12b receives the power signal, so that the driving current may be formed between the second anode 121b and the cathode 122 to drive the light-emitting material layer 123 to emit light.

Similarly, a first light-emitting device 12a includes a first anode 121a, the cathode 122, and the light-emitting material layer 123 disposed between the first anode 121a and the cathode 122. The light-emitting material layer 123 is driven by a driving current between the first anode 121a and the cathode 122 to emit light.

The first anode 121a of the first light-emitting device 12a passes through the first through hole 151 in the second planarization layer 15 to be electrically connected to the transparent wiring 16 (as shown in FIG. 3), and then the transparent wiring 16 is electrically connected to the driving circuit D (as shown in FIG. 4), so that the driving circuit D is electrically connected to the first anode 121a of the first light-emitting device 12a through the transparent wiring 16. The driving circuit D is used to transmit the driving signal to the first anode 121a of the first light-emitting device 12a, and the cathode 122 of the first light-emitting device 12a receives the power signal, so that the driving current may be formed between the first anode 121a and the cathode 122 to drive the light-emitting material layer 123 to emit light.

It will be noted that, FIG. 3 is illustrated by taking an example in which the cathode 122 of the first light-emitting device 12a and the cathode 122 of the second light-emitting device 12b are of an integrated structure. However, the cathode 122 of the first light-emitting device 12a and the cathode 122 of the second light-emitting device 12b may also be independent structures, that is, the first light-emitting device 12a includes a first cathode, and the second light-emitting device 12b includes a second cathode. In this case, the first cathode and the second cathode may be electrically connected or insulated from each other, which is not limited in the embodiments of the present disclosure.

In some embodiments, as shown in FIG. 3, the first anode 121a is of a composite structure of indium tin oxide/silver/indium tin oxide (ITO/Ag/ITO). As shown in FIG. 3, the display panel 100 further includes a pixel defining layer (PDL) disposed on a side of the second planarization layer 15 away from the base 11, the pixel defining layer has a plurality of openings, and the light-emitting material layers 123 are located in corresponding openings. Therefore, the PDL exists between adjacent light-emitting material layers 123, so as to avoid crosstalk of light of primary colors emitted by adjacent light-emitting devices 12.

In some embodiments, a main constituent of the PDL is an organic material. For example, the PDL may be mainly made of black acrylic, or the PDL may also be mainly made of polyacrylate.

In addition, as shown in FIG. 3, the display panel 100 further includes a support layer 17, and the support layer 17 is disposed on a surface of the PDL away from the base 11. The support layer 17 may be used to support a fine metal mask (FMM) when the light-emitting material layer 123 is evaporated, Moreover, the display panel 100 further includes a first organic polymer layer 18, a first barrier layer 19, a second organic polymer layer 18', a second barrier layer 19', and a buffer layer 20 that are stacked on the base 11 in sequence, In this case, the driving circuits D and the light-emitting devices 12 are all disposed on a surface of the buffer layer 20 away from the base 11.

The first organic polymer layer 18 may be made of, for example, polyimide (PI).

The first barrier layer 19 may be made of an inorganic material, which may be, for example, at least one of silicon oxide, silicon nitride, or silicon oxynitride.

The second organic polymer layer 18' may be made of, for example, PI.

The second barrier layer 19' may be made of an inorganic material, which may be, for example, at least one of silicon oxide, silicon nitride, or silicon oxynitride.

The buffer layer 20 may be made of an inorganic material, which may be, for example, at least one of silicon oxide, silicon nitride, or silicon oxynitride.

It is well known that, the higher pixels per inch (PPI) of the display panel 100 is, the clearer an image displayed by the electronic apparatus 1000 will be, and the better visual experience of the users will be. In view of this, the users have an increasing demand for the electronic apparatus with high PPI.

However, in the electronic apparatus with high PPI, the number of pixels per unit area in the display panel 100 is relative large, and the number of light-emitting devices 12 per unit area in the display panel 100 is relative large. As a consequence, in the camera region S, the number of first light-emitting devices 12a per unit area in the display panel 100 is relative large, and the number of transparent wirings 16 that are in a one-to-one correspondence with the first light-emitting devices 12a is relative large. However, it will be difficult to arrange a large number of transparent wirings 16 in the display panel 100. In order to arrange the plurality of transparent wirings 16, in an arrangement manner shown as FIG. 3, a gap between adjacent transparent wirings 16 will be reduced, which will require a very high process accuracy of preparing the transparent wirings 16. For example, the transparent wirings 16 may be prepared by using the wet etching process, and an accuracy of the wet etching process is approximately 4.0 microns, which is difficult to meet the preparation requirement of the transparent wirings 16 in the display panel 100 with high PPI. In addition, an increase in the number of transparent wirings 16 will also cause a decrease in the light transmittance of the camera region S, which is not conducive to image capture and shooting by the camera of the electronic apparatus. In order to solve the above problems, the embodiments of the present disclosure provide a display panel 100. The difference from the display panel 100 described above is that an insulating layer included in the display panel 100 has a plurality of first grooves, and the plurality of transparent wirings 16 are disposed on groove walls of the plurality of first grooves, Hereinafter, some embodiments will be described to illustrate the display panel 100 provided by the embodiments of the present disclosure.

Figure 5A:
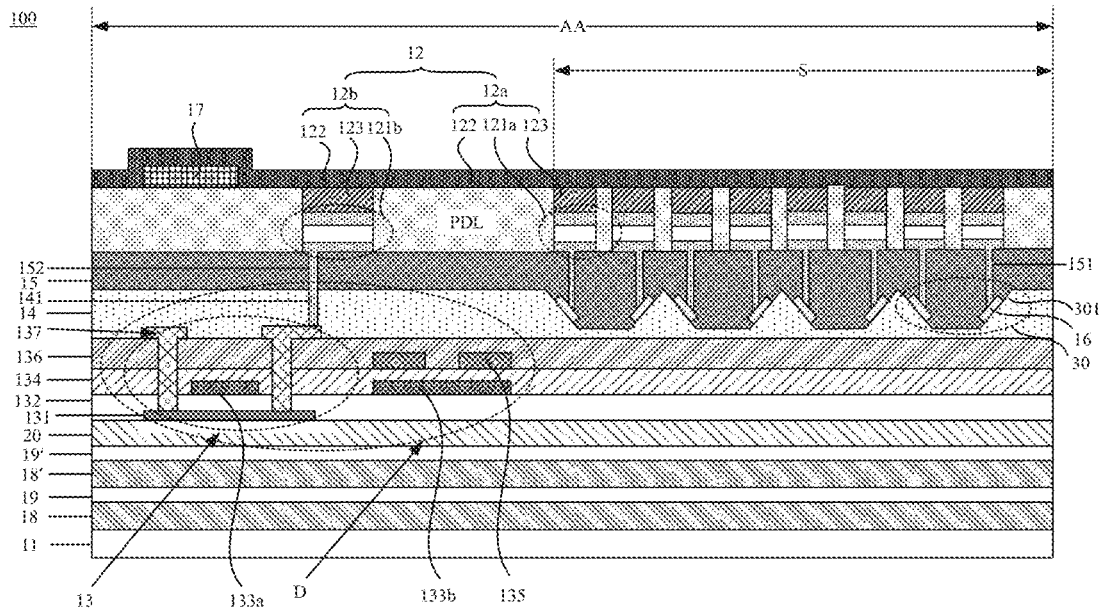
FIG. 5A is a structural diagram of yet another display panel, in accordance with some embodiments.

In some embodiments, as for the display panel 100, as shown in FIG. 5A, the display panel 100 includes a base 11, driving circuits D, transparent wirings 16, first light-emitting devices 12a, second light-emitting devices 12b, and a support layer 17. It will be noted that, FIG. 5A only shows a driving circuit D as an example for description.

The base 11, the driving circuits D, the transparent wirings 16, the first light-emitting devices 12a, the second light-emitting devices 12b, and the support layer 17 are the same as those in the above-mentioned display panel 100, and reference may be made to the above description, which will not be repeated here.

In some embodiments, the display panel 100 further includes at least one polymer layer and at least one barrier layer that are disposed between the base 11 and the driving circuits D.

For example, the display panel 100 includes a plurality of polymer layers and a plurality of barrier layers, and the plurality of polymer layers and the plurality of barrier layers are alternately arranged.

For example, as shown in FIG. 5A, the display panel 100 includes a first organic polymer layer 18, a first barrier layer 19, a second organic polymer layer 18', a second barrier layer 19", and a buffer layer 20 that are stacked on the base 11 in sequence.

The first organic polymer layer 18, the first barrier layer 19, the second organic polymer layer 18", the second barrier layer 19', and the buffer layer 20 are the same as those described above, and reference may be made to the above description, which will not be repeated here.

Or, for example, the display panel 100 includes a polymer layer and a barrier layer.

Figure 6:
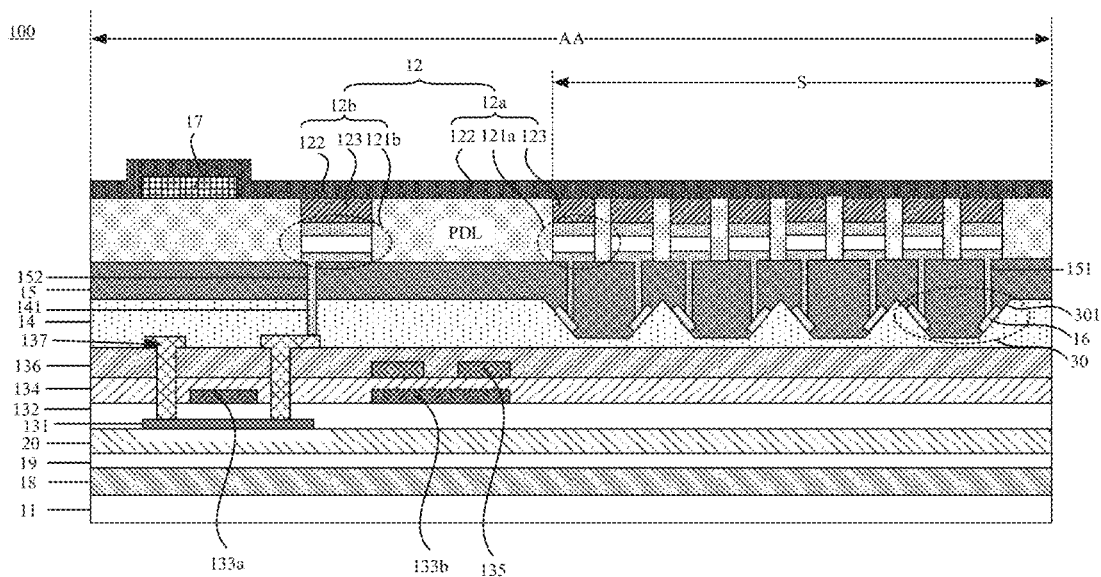
FIG. 6 is a structural diagram of yet another display panel, in accordance with some embodiments.

For example, as shown in FIG. 6, the display panel 100 includes a first organic polymer layer 18, a first barrier layer 19, and a buffer layer 20 that are sequentially stacked on the base 11.

In some embodiments provided in the present disclosure, the display panel 100 further includes a first planarization layer 14 and a second planarization layer 15 disposed on the first planarization layer 14.

Based on the description of the display panel 100 provided by the embodiments of the present disclosure, in some embodiments, the insulating layer is the first planarization layer 14.

That is, the first planarization layer 14 includes the plurality of first grooves 30.

Figure 5B:
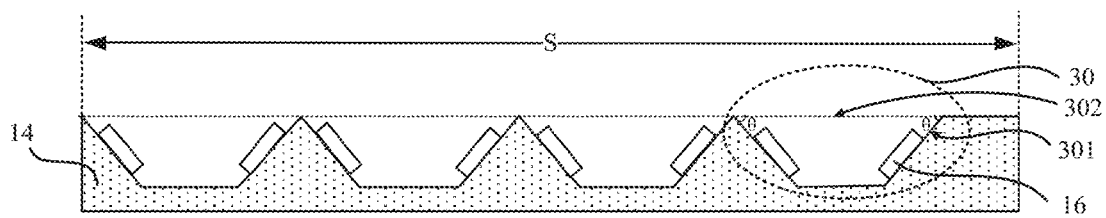
FIG. 5B is a structural diagram of a first planarization layer, in accordance with some embodiments.

For example, as shown in FIG. 5A, the first planarization layer 14 is disposed on the base 11, and the first planarization layer 14 has the plurality of first grooves 30 located in the camera region S. An included angle θ between a groove wall 301 of a first groove 30 and a surface 302 on which an opening of the first groove 30 is located is less than 90 degrees (as shown in FIG. 5B), The transparent wirings 16 are disposed on the groove walls 301. In this way, a surface of the first planarization layer 14 in the camera region S away from the base 11 is not a plane parallel with the base 11, but an uneven surface, Therefore, an area of the surface of the first planarization layer 14 in the camera region S away from the base 11 increases. In this way, in an aspect, there will be more space in the camera region S to arrange the transparent wirings 16, so as to meet the requirements for the electronic apparatus with high PPI. In another aspect, spacings among the transparent wirings 16 may increase in structure, so as to avoid a limitation on a minimum spacing in the wet etching process and reduce the requirements for the accuracy of the wet etching process. In yet another aspect, the transparent wiring 16 is disposed on the groove wall 301, and the included angle θ between the groove wall 301 of the first groove 30 and the surface 302 on which the opening of the first groove 30 is located is less than 90 degrees, that is, the groove wall 301 of the first groove 30 is an inclined surface relative to a surface of the base 11, so that an area of an orthographic projection of the transparent wiring 16 on the base 11 will be reduced. Moreover, the transparent wiring 16 is not completely transparent, for example, in a case where the transparent wiring 16 is made of ITO, the light transmittance thereof is approximately 80%, Therefore, if the area of the orthographic projection of the transparent wiring 16 on the base 11 becomes smaller, a light-shielding area of the transparent wiring 16 will be smaller, which is beneficial to the increase of the light transmittance of the camera region S and the shooting by the camera.

In some embodiments, the included angle θ between the groove wall 301 of the first groove 30 and the surface 302 on which the opening of the first groove 30 is located is in a range of 20 to 80 degrees, inclusive. With this range of angles, the process may be well realized.

In some embodiments, the included angle θ between the groove wall 301 of the first groove 30 and the surface 302 on which the opening of the first groove 30 is located is in a range of 60 to 80 degrees, inclusive. Within a range that may be achieved by the process, the smaller the included angle θ between the groove wall 301 of the first groove 30 and the surface 302 on which the opening of the first groove 30 is located is, the smaller the area of the orthographic projection of the groove wall 301 of the first groove 30 on the base 11 is, and the smaller an area of the camera region S occupied by each first groove 30 will be. In this way, there may be more first grooves 30 disposed in the camera region S, which may also be understood that, there may be more groove walls 301 to carry the transparent wirings 16, so as to meet the requirements for the electronic apparatus with high PPI. In addition, the area of the orthographic projection, on the base 11, of the transparent wiring 16 on the groove wall 301 may be smaller, and then the light shielding property of the transparent wiring 16 may be reduced, so that the light transmittance of the camera region S may increase.

In some embodiments, as shown in FIG. 5B, among the plurality of first grooves 30, the included angles θ between the groove walls 301 of the first grooves 30 and the surfaces 302 on which the openings of the first grooves 30 are located are the same. That is, shapes and sizes of the plurality of first grooves 30 are completely the same. In this way, the difficulty in a process of preparing the plurality of first grooves 30 may be lowered.

Or, in some other embodiments, the shapes of the plurality of first grooves 30 are not completely the same, or completely different.

In the embodiments of the present disclosure, the "same" means that the shapes of the first grooves 30 are the same (for example, all are trapezoidal), the included angles θ between the groove walls 301 of the first grooves 30 and the surfaces 302 on which the openings of the first grooves 30 are located are the same (for example, all are a certain number of degrees), widths and lengths of the groove bottoms are the same, and depths of the grooves are the same. That is, the plurality of first grooves 30 are mutually cloned and completely identical. Of course, it will be understood that differences within an error range of the process should fall into the protection scope of the embodiments of the present disclosure, In some embodiments, as shown in FIG. 5B, in each first groove 30, the included angles θ between two groove walls 301 and the surface 302 on which the opening of the first groove 30 is located are the same. In this way, the difficulty in the process of preparing the first groove 30 may be reduced.

Or, in some other embodiments, in each first groove 30, the included angles θ between the two groove walls 301 and the surface 302 on which the opening of the first groove 30 is located are different.

In some embodiments, as shown in FIG. 5A, the groove walls 301 of adjacent first grooves 30 intersect, that is, the groove walls 301 of adjacent first grooves 30 are connected and there is no gap between the openings of adjacent first groove 30. In this way, a gap between the groove walls 301 of adjacent first grooves 30 is avoided, and the plurality of first grooves 30 are arranged in a closest arrangement. That is, in this arrangement of the first grooves 30, a relatively large number of first grooves 30 may be provided in the camera region S, so that a relatively large number of transparent wirings 16 may be placed on the groove walls 301 of the first grooves 30, which helps to meet the requirements for the electronic apparatus with high PPI.

In some embodiments, as shown in FIG. 5A, the first groove 30 is a quadrangular prism groove whose cross section is inverted trapezoidal. That is, on a plane perpendicular to the base 11 and an extending direction of the first groove 30, a cross-sectional shape of the first groove 30 is an inverted trapezoid.

Or, in some other embodiments, the first groove 30 is a triangular prism groove. That is, on the plane perpendicular to the base 11 and the extending direction of the first groove 30, a cross-sectional shape of the first groove 30 is a triangle.

Figure 5C:
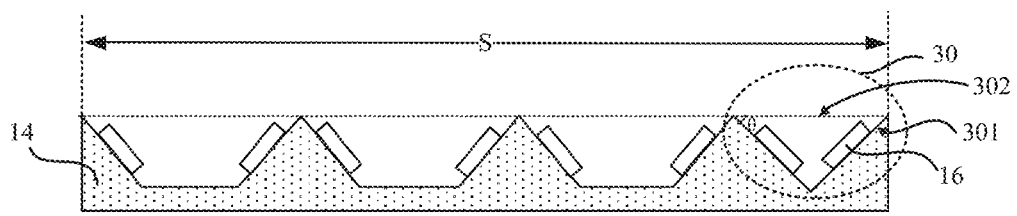
FIG. 5C is a structural diagram of another first planarization layer, in accordance with some embodiments.

In some embodiments, the plurality of first grooves 30 have different shape types. For example, as shown in FIG. 5C, among the plurality of first grooves 30, cross-sectional shapes of a part of first grooves 30 are inverted trapezoids, and cross-sectional shapes of another part of first grooves 30 are triangles.

In this way, the shape types of the first grooves 30 may be flexibly selected according to sizes of spaces at different positions in the camera region S. For example, the quadrangular prism groove whose cross section is inverted trapezoidal may be disposed at a relatively sufficient space; and the triangular prism groove may be disposed at a relatively narrow space such as an edge of the camera region S.

Figure 7A:
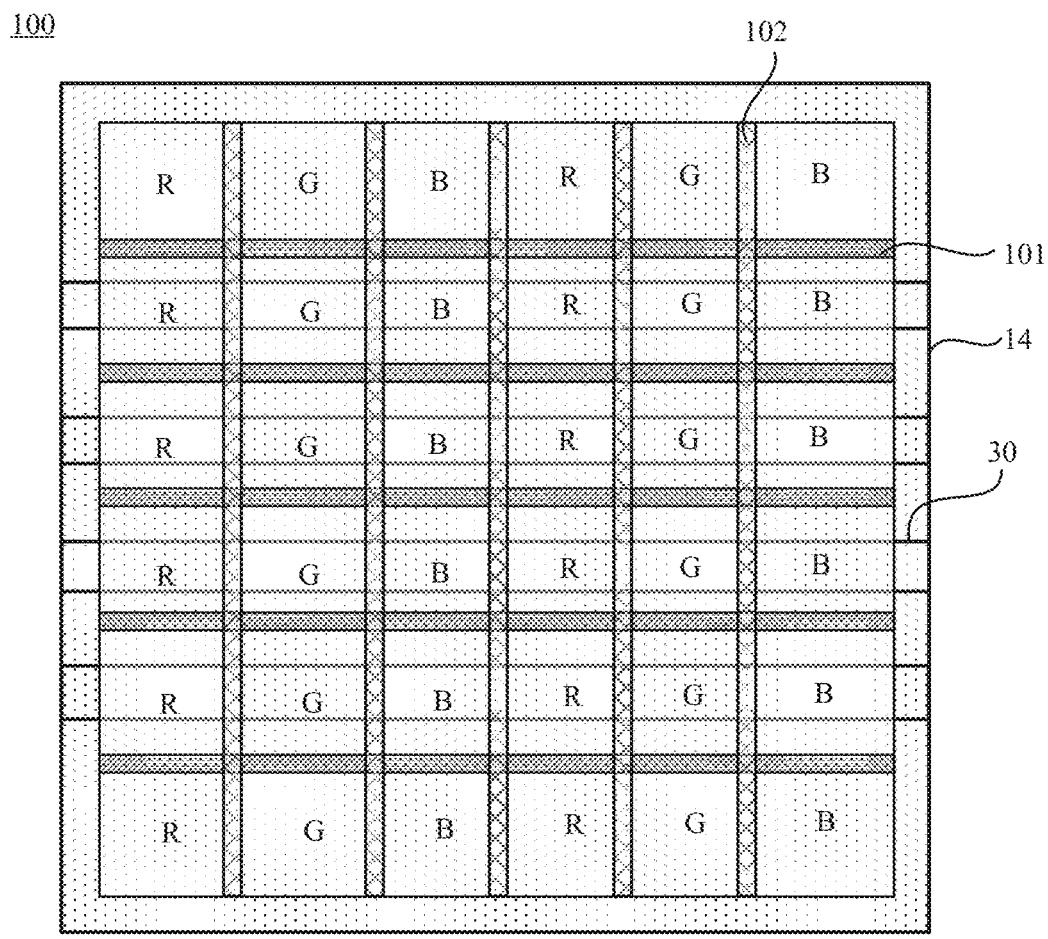
FIG. 7A is a structural diagram of yet another display panel, in accordance with some embodiments.

In some embodiments, as shown in FIG. 7A, an extending direction of the first groove 30 is parallel with an extending direction of gate lines 101 in the display panel 100.

Figure 7B:
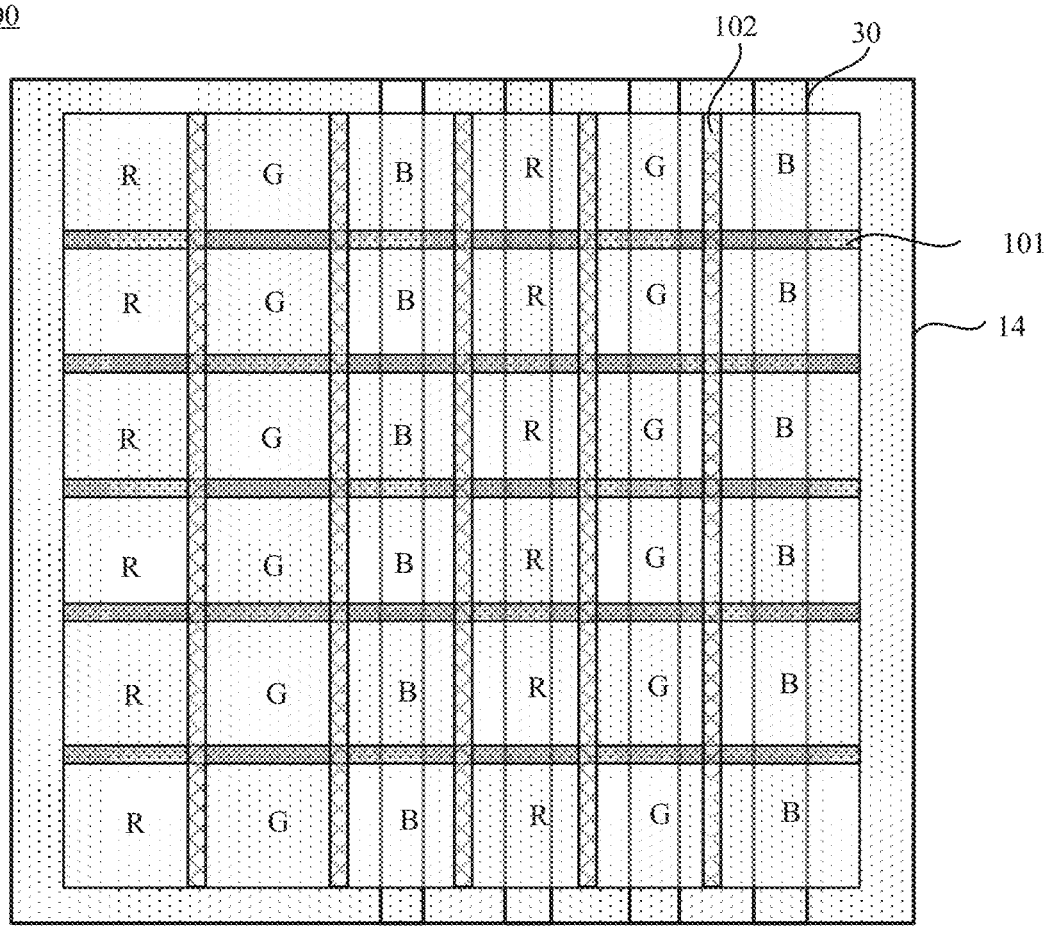
FIG. 7B is a structural diagram of yet another display panel, in accordance with some embodiments.

Or, in some other embodiments, as shown in FIG. 7B, the extending direction of the first groove 30 is parallel with an extending direction of data lines 102 in the display panel 100.

In this way, whether it is a line of sub-pixels parallel with the extending direction of the gate lines or a line of sub-pixels parallel with the extending direction of the data lines, the first grooves 30 may be arranged correspondingly to the line of sub-pixels. That is, the first grooves 30 may neatly correspond to a plurality of sub-pixels in the line of sub-pixels, or the first grooves 30 may neatly correspond to the first light-emitting devices 12a in the plurality of sub-pixels (one sub-pixel includes one light-emitting device). Therefore, the transparent wirings 16 electrically connected to the first light-emitting devices 12a may be relatively neatly arranged on the groove walls 301 of the first grooves 30, which may avoid a disorderly arrangement of the transparent wirings 16 due to irregular arrangement of the first grooves 30 (for example, the extending direction of the first groove 30 intersects the extending direction of the gate lines or the extending direction of the data lines), and a problem of mutual interference between the transparent wirings 16 and other signal lines in the display panel 100 that may be caused.

In some embodiments, a groove wall 301 of the first groove 30 is disposed under each line of first light-emitting devices 12a parallel with the extending direction of the first groove 30.

Figure 8:
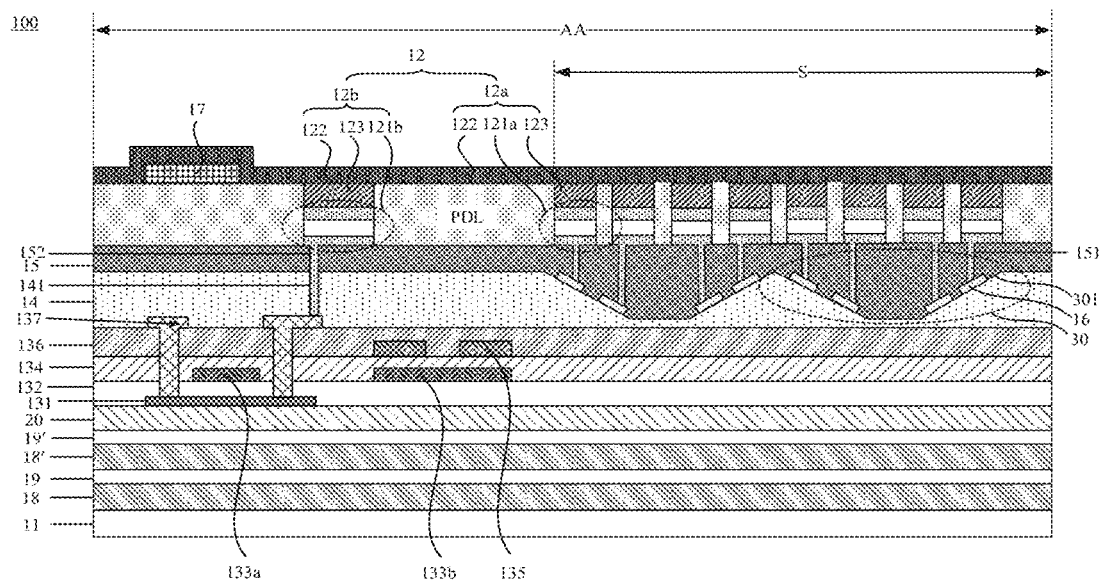
FIG. 8 is a structural diagram of yet another display panel, in accordance with some embodiments.

For example, as shown in FIG. 8, lines of first light-emitting devices 12a parallel with the extending direction of the first groove 30 correspond to a same groove wall 301 thereunder.

Or it is understood that one groove wall 301 of one first groove 30 corresponds to lines of first light-emitting devices 12a.

In this way, the size of the first groove 30 may be set according to the size of the space in the camera region S. For example, in a case where the space in the camera region S is sufficient, the first groove 30 with a relatively large size may be arranged. The large-sized first groove 30 disposed in the camera region S may reduce the requirements for the accuracy of the preparation process of the first grooves 30.

Or, for example, as shown in FIG. 5A, lines of first light-emitting devices 12a parallel with the extending direction of the first groove 30 are in a one-to-one correspondence with the groove walls 301 of the first grooves.

Or it is understood that one groove wall 301 of one first groove 30 corresponds to one line of first light-emitting devices 12a.

In this way, the number of transparent wirings 16 disposed on one groove wall 301 of one first groove 30 is relatively small, and an area of the groove wall 301 required is relatively small. Thus, in a case where an included angle between the groove wall 301 and the groove bottom 302 does not increase, a requirement for a thickness of the first planarization layer 14 may be reduced.

In some embodiments, as shown in FIG. 5A, the first light-emitting devices 12a of the display panel 100 are disposed on the second planarization layer 15, and the first anode 121a of the first light-emitting device 12a passes through a first through hole 151 in the second planarization layer 15 to be electrically connected to the transparent wiring 16.

The driving circuit D of the display panel 100 is electrically connected to the transparent wiring 16, so as to realize that the driving circuit D is electrically connected to the first anode 121a of the first light-emitting device 12a through the transparent wiring 16. In this way, the driving circuit D may transmit the driving signal to the first anode 121a of the first light-emitting device 12a.

In some embodiments, as shown in FIG. 5A, the second light-emitting device 12b of the display panel 100 is disposed on the second planarization layer 15, and the second anode 121b of the second light-emitting device 12b passes through a fourth through hole 152 in the second planarization layer 15 and a third through hole 141 in the first planarization layer 14 to be electrically connected to the driving circuit D.

A manufacturing process of the display panel 100 is as follows.

Figure 9:
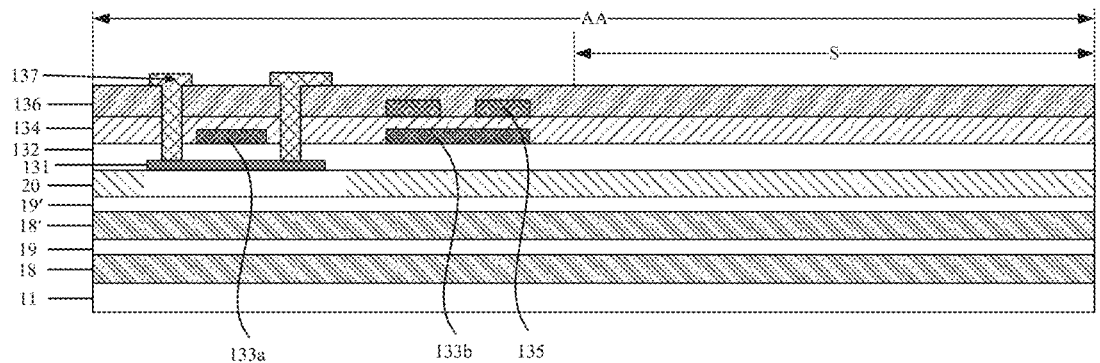
FIG. 9 is a structural diagram of a substrate, in accordance with some embodiments.

As shown in FIG. 9, the first organic polymer layer 18, the first barrier layer 19, the second organic polymer layer 18', the second barrier layer 19', the buffer layer 20, an active pattern 131, a first gate insulating layer 132, a gate 133a and a first electrode 133b, a second gate insulating layer 134, a second electrode 135, an interlayer dielectric layer 136, and a source-drain electrode layer 137 are sequentially formed on the base 11. The source 137a and the drain 137b in the source-drain electrode layer 137 are electrically connected to the active pattern 131 through holes disposed in the first gate insulating layer 132, the second gate insulating layer 134, and the interlayer dielectric layer 136. It will be understood that, only one driving transistor is used as an example for description.

In some embodiments, the active pattern 131, the gate 133a and the first electrode 133b, the second electrode 135, and the source-drain electrode layer 137 may each be prepared by a patterning process (which includes steps of, for example, gluing, exposing, developing, and etching).

In addition, it will be seen from the above description that in order to prevent the driving circuit D from blocking the light in the camera region S of the display panel 100, the driving circuit D is not disposed in the camera region S. Therefore, the active pattern 131, the gate 133a and the first electrode 133b, the second electrode 135, and the source-drain electrode layer 137 are not formed in the camera region S. That is, the first organic polymer layer 18, the first barrier layer 19, the second organic polymer layer 18', the second barrier layer 19', the buffer layer 20, the first gate insulating layer 132, the second gate insulating layer 134, and the interlayer dielectric layer 136 are sequentially formed on the base 11 in the camera region S.

It will be noted that, a same layer in both the camera region S and a non-camera region of the active area AA of the display panel 100 are formed in a same process. That is, the same layer is simultaneously formed in both the camera region S and the non-camera region of the active area AA.

Figure 10:
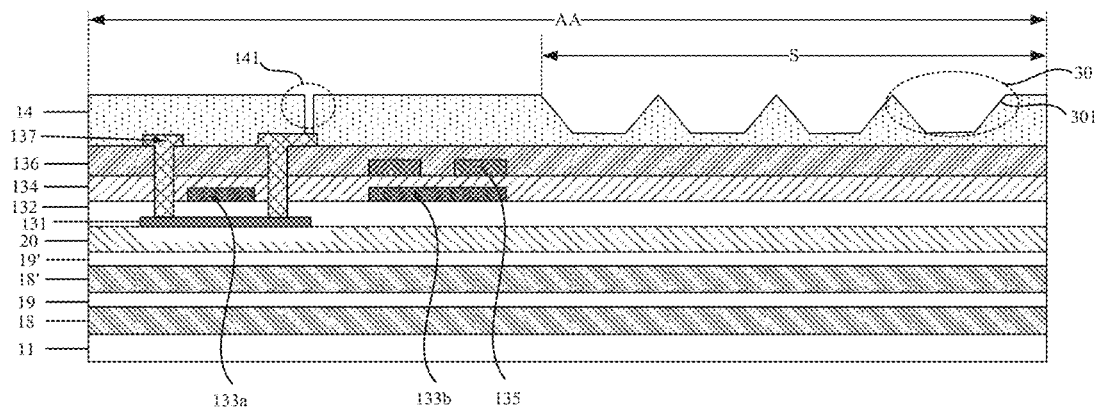
FIG. 10 is a structural diagram after a first planarization layer is formed on the substrate in FIG. 9.

As shown in FIG. 10, the first planarization layer 14 is formed (for example, by coating) on a surface of a substrate shown in FIG. 9, and then the third through hole 141 and the first grooves 30 are formed in the first planarization layer 14. The third through hole 141 is formed at a position that is in the active area AA and outside the camera region S, and corresponds to a portion of the source-drain electrode layer 137 (that is, an orthogonal projection of the third through hole 141 on the base 11 overlaps with an orthographic projection of the source-drain electrode layer 137 on the base 11). The first grooves 30 are formed in the camera region S.

The third through hole 141 and the first grooves 30 may be prepared by a same patterning process (which includes steps of, for example, gluing, exposing, and developing).

Figure 11:
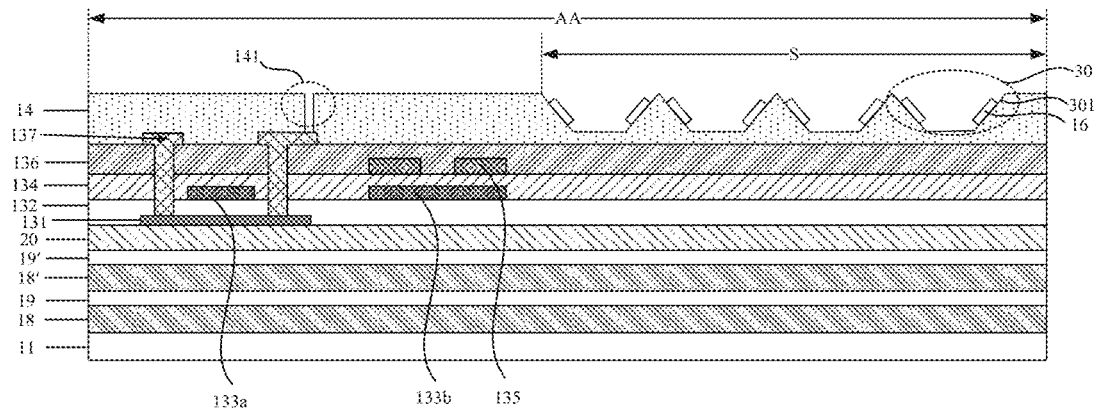
FIG. 11 is a structural diagram after transparent wirings are formed on the substrate in FIG. 10.

As shown in FIG. 11, the transparent wirings 16 are formed on the groove walls 301 of the first grooves 30 by, for example, deposition (e.g., evaporation, sputtering, or chemical vapor deposition). It will be understood that, one or more transparent wirings 16 may be formed on a surface of one groove wall 301, and FIG. 11 shows an example in which only one transparent wiring16 is formed on the surface of the groove wall 301.

Figure 12:
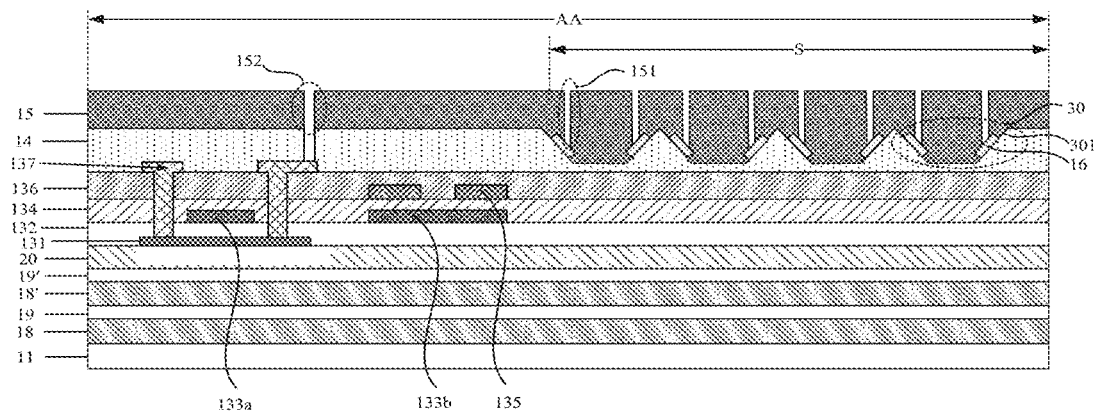
FIG. 12 is a structural diagram after a second planarization layer is formed on the substrate in FIG. 11.

After that, as shown in FIG. 12, the second planarization layer 15 is formed on surfaces of the first planarization layer 14 and the transparent wirings 16, and then the first through holes 151 and the fourth through hole 152 are formed in the second planarization layer 15 through the steps of gluing, exposing, developing, etc. The first through holes 151 are formed in the camera region S and each correspond to a position of the transparent wiring 16. That the first through hole 151 corresponds to the position of the transparent wiring 16 here may be understood that an orthogonal projection of the first through hole 151 on the base 11 overlaps with an orthographic projection of the transparent wiring 16 on the base 11. The fourth through hole 152 is formed in the active area AA and located outside the camera region S, and corresponds to the third through hole 141. That is, an orthogonal projection of the fourth through hole 152 on the base 11 completely overlaps with the orthogonal projection of the third through hole 141 on the base 11. Therefore, the fourth through hole 152 and the third through hole 141 may communicate with each other to penetrate the second planarization layer 15 and the first planarization layer 14.

Figure 13:
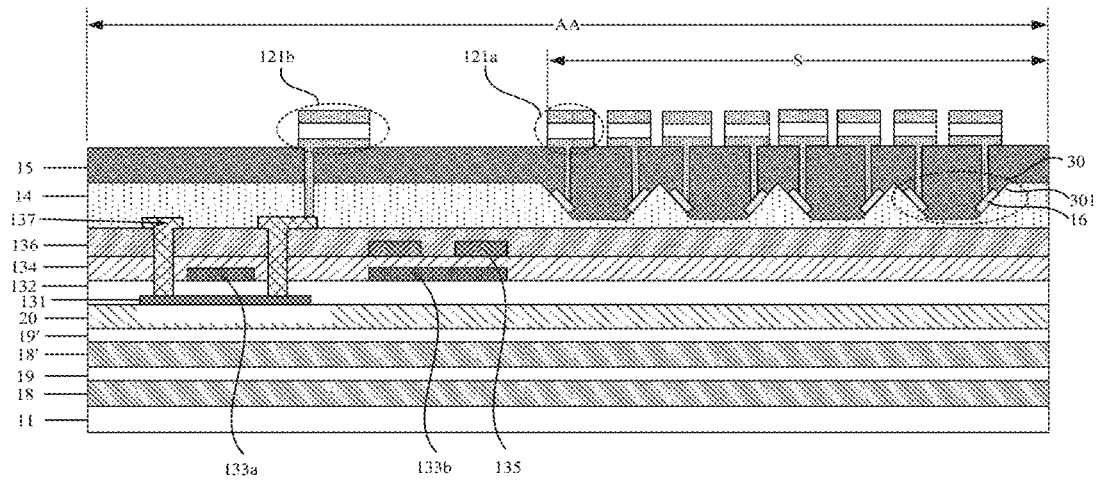
FIG. 13 is a structural diagram after a first anode and a second anode are formed on the substrate in FIG. 12.

Next, as shown in FIG. 13, the first anodes 121a and the second anode 121b are formed on a surface of the second planarization layer 15 away from the base 11. Therefore, the first anodes 121a are electrically connected to the transparent wirings 16 respectively at positions of the first through holes 151 to form conductive paths, and the second anode 121b is electrically connected to the driving transistor at a position of the third through hole 141 and the fourth through hole 152 to form a conductive path. The first anodes 121a and the second anode 121b may be prepared synchronously through the same patterning process (which includes steps of, for example, gluing, exposing, developing, and etching). The first anode 121a is electrically connected to the transparent wiring 16 through the first through hole 151. The second anode 121b is electrically connected to the source-drain electrode layer 137 through the fourth through hole 152 and the third through hole 141.

Figure 14:
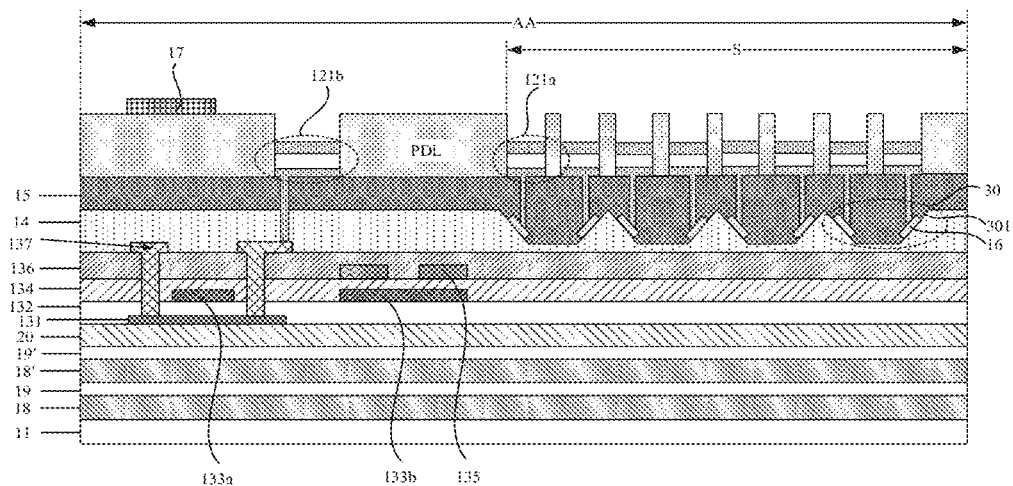
FIG. 14 is a structural diagram after a pixel defining layer and a support layer are formed on the substrate in FIG. 13.

Then, as shown in FIG. 14, a pixel defining layer (PDL) is formed on a surface of the second planarization layer 15. The pixel defining layer has a plurality of openings, and the plurality of openings correspond to the positions of the anodes, that is, the anodes are exposed, so that the pixel defining layer is located between adjacent anodes (including between the first anode 121a and the second anode 121b). A support layer 17 is formed on the pixel defining layer.

Hereinafter, light-emitting material layers 123 and cathodes 122 are formed on the substrate shown in FIG. 14, so that the manufacturing of the display panel 100 is completed, and the display panel 100 shown in FIG. 5A is obtained.

Figure 15:
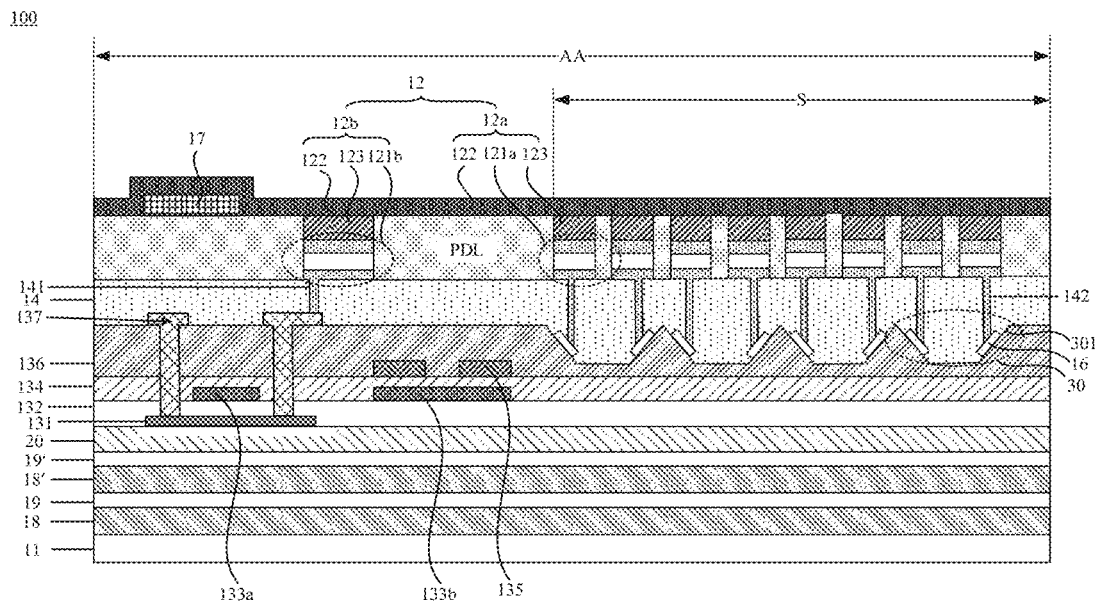
FIG. 15 is a structural diagram of yet another display panel, in accordance with some embodiments.

In some other embodiments, a difference from the above embodiments is that, as shown in FIG. 15, the insulating layer provided with the plurality of first grooves 30 in the display panel 100 is an interlayer insulating layer, which is not the first planarization layer 14.

As shown in FIG. 15, the display panel 100 includes the first planarization layer 14. The first planarization layer 14 includes the third through hole 141 located in the active area AA and outside the camera region S, and second through holes 142 located in the camera region S. A second through hole 142 is used to form a conductive path for coupling the first anode 121a of the first light-emitting device 12a and the transparent wiring 16, and the third through hole 141 is used to form a conductive path for coupling the second anode 121b of the second light-emitting device 12b and the thin film transistor 13.

The display panel 100 may or may not include the second planarization layer 15.

In some embodiments of the present disclosure, as shown in FIG. 15, the display panel 100 includes a source-drain electrode layer 137 disposed on the interlayer insulating layer. In this case, the interlayer insulating layer is the interlayer dielectric layer 136 of the display panel 100.

The interlayer dielectric layer 136 is provided with the plurality of first grooves 30, and the plurality of first grooves 30 are located in the camera region S. An included angle θ between a groove wall 301 of a first groove 30 and a surface 302 on which an opening of the first groove 30 is located is less than 90 degrees. The transparent wirings 16 are disposed on the groove walls 301.

In some embodiments, the plurality of first grooves 30 may be prepared by the patterning process (which includes steps of, for example, gluing, exposing, developing, and etching).

The shape type of the first groove 30, the included angle θ between the groove wall 301 of the first groove 30 and the surface 302 on which the opening of the first groove 30 is located, the extending direction of the first groove 30, and the corresponding relationships between the groove walls 301 of the first grooves 30 and the first light-emitting devices 12a are the same as the conditions when the insulating layer is the first planarization layer 14, and reference may be made to the above descriptions.

In some embodiments, as shown in FIG. 15, the first light-emitting devices 12a of the display panel 100 are disposed on the first planarization layer 14, and the first anode 121a of the first light-emitting device 12a passes through a second through hole 142 in the first planarization layer 14 to be electrically connected to the transparent wiring 16.

The driving circuit D of the display panel 100 is electrically connected to the transparent wiring 16, so as to realize that the driving circuit D is electrically connected to the first anode 121a of the first light-emitting device 12a through the transparent wiring 16. In this way, the driving circuit D may transmit a driving signal to the first anode 121a of the first light-emitting device 12a.

In some embodiments, as shown in FIG. 15, the second light-emitting device 12b of the display panel 100 is disposed on the first planarization layer 14, and the second anode 121b of the second light-emitting device 12b passes through the third through hole 141 in the first planarization layer 14 to be electrically connected to the driving circuit D.

Figure 16:
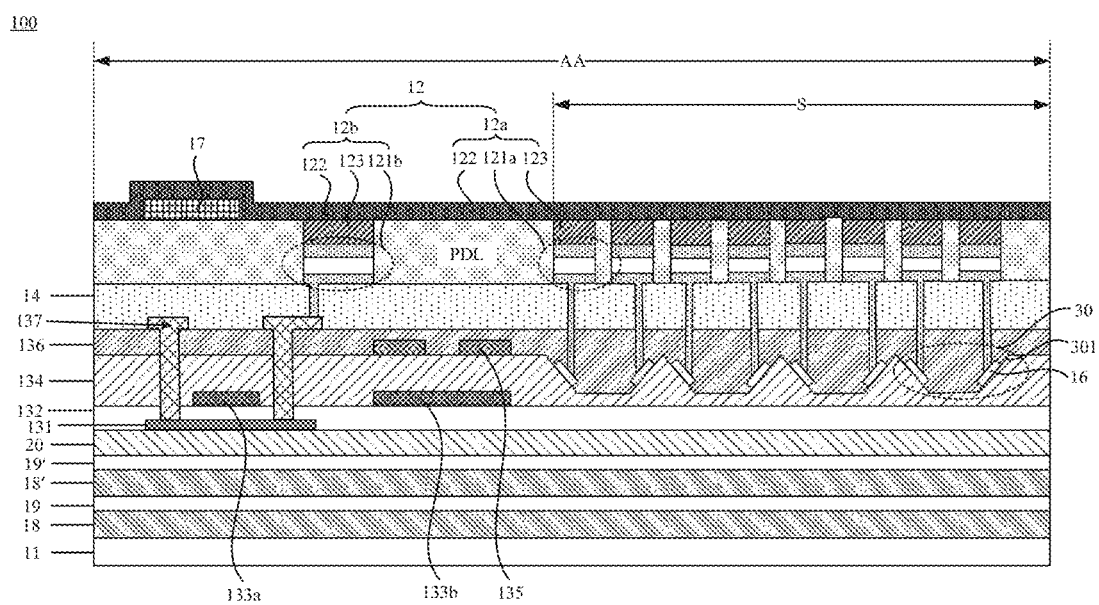
FIG. 16 is a structural diagram of yet another display panel, in accordance with yet other embodiments.

In some other embodiments of the present disclosure, the thin film transistor of the display panel 100 may have a double-gate structure, that is, the thin film transistor includes two gates. In this case, the first electrode 133b and the second electrode 135 are each disposed in a same layer as the two gates of the thin film transistor, In some embodiments, as shown in FIG. 16, the second electrode 135 is disposed on the interlayer insulating layer. In this case, the interlayer insulating layer may be a second gate insulating layer 134 of the display panel 100.

The second gate insulating layer 134 is provided with a plurality of first grooves 30, and the plurality of first grooves 30 are located in the camera region S. An included angle θ between a groove wall 301 of a first groove 30 and a surface 302 on which an opening of the first groove 30 is located is less than 90 degrees. The transparent wiring 16 is disposed on the groove wall 301.

For example, the plurality of first grooves 30 may be prepared by the patterning process (which includes steps of, for example, gluing, exposing, developing, and etching).

The shape type of the first groove 30, the included angle θ between the groove wall 301 of the first groove 30 and the surface 302 on which the opening of the first groove 30 is located, the extending direction of the first groove 30, and the corresponding relationships between the groove walls 301 of the first grooves 30 and the first light-emitting devices 12a are the same as the conditions when the insulating layer is the first planarization layer 14, and reference may be made to the above descriptions.

In some other embodiments, the first electrode 133b is disposed on an interlayer insulating layer. In this case, the interlayer insulating layer may be the first gate insulating layer 132 of the display panel 100.

The first gate insulating layer 132 is provided with a plurality of first grooves 30, and the plurality of first grooves 30 are located in the camera region S. An included angle θ between a groove wall 301 of a first groove 30 and a surface 302 on which an opening of the first groove 30 is located is less than 90 degrees. The transparent wirings 16 are disposed on the groove walls 301.

For example, the plurality of first grooves 30 may be prepared by the patterning process (which includes steps of, for example, gluing, exposing, developing, and etching).

The shape type of the first groove 30, the included angle θ between the groove wall 301 of the first groove 30 and the surface 302 on which the opening of the first groove 30 is located, the extending direction of the first groove 30, and the corresponding relationships between the groove walls 301 of the first grooves 30 and the first light-emitting devices 12a are the same as the conditions when the insulating layer is the first planarization layer 14, and reference may be made to the above descriptions.

Figure 17:
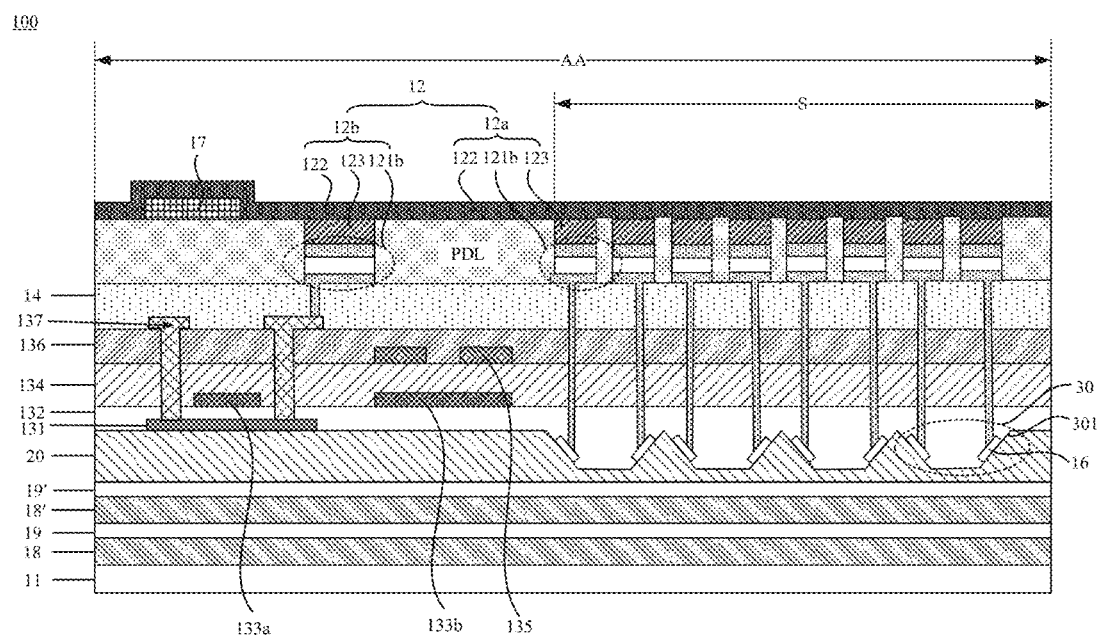
FIG. 17 is a structural diagram of a display panel, in accordance with some embodiments.

In yet other embodiments of the present disclosure, the display panel 100 includes an active pattern 131, and the active pattern 131 is disposed on an interlayer insulating layer. In this case, the interlayer insulating layer may be any of the first organic polymer layer 18, the first barrier layer 19, the second organic polymer layer 18', the second barrier layer 19', or the buffer layer 20 of the display panel 100. For example, as shown in FIG. 17, the interlayer insulating layer is the buffer layer 20. The buffer layer 20 is provided with a plurality of first grooves 30, and the plurality of first grooves 30 are located in the camera region S. An included angle θ between a groove wall 301 of a first groove 30 and a surface 302 on which an opening of the first groove 30 is located is less than 90 degrees. The transparent wirings 16 are disposed on the groove walls 301, For example, the plurality of first grooves 30 may be prepared by the patterning process (which includes steps of, for example, gluing, exposing, developing, and etching).

The shape type of the first groove 30, the included angle θ between the groove wall 301 of the first groove 30 and the surface 302 on which the opening of the first groove 30 is located, the extending direction of the first groove 30, and the corresponding relationships between the groove walls 301 of the first grooves 30 and the first light-emitting devices 12a are the same as the conditions when the insulating layer is the first planarization layer 14, and reference may be made to the above descriptions.

In this way, when the insulating layer is the interlayer insulating layer, the insulating layer may be any layer between the source-drain electrode layer 137 and the base 11. That is, the first groove 30 may be flexibly disposed in a suitable layer according to actual situations, and an applicability increases.

In summary, the first grooves 30 located in the camera region S are disposed in the insulating layer, and the surface of the insulating layer in the camera region S away from the base 11 is not a plane parallel with the base 11, but an uneven surface. Therefore, an area of the surface of the insulating layer in the camera region S away from the base 11 increases. In this way, in an aspect, there will be more space in the camera region S to arrange the plurality of transparent wirings 16 to meet requirements for the electronic apparatus with high PPE, In another aspect, spacings among the transparent wirings 16 may increase in structure, so as to avoid a limitation on a minimum spacing in the wet etching process, and reduce the requirements for the accuracy of the wet etching process. In yet another aspect, the transparent wiring 16 is disposed on the groove wall 301, and the included angle θ between the groove wall 301 of the first groove 30 and the surface 302 on which the opening of the first groove 30 is located is less than 90 degrees, that is, the groove wall 301 of the first groove 30 is an inclined surface relative to a surface of the base 11, so that an area of an orthographic projection of the transparent wiring 16 on the base 11 will be reduced, Moreover, the transparent wiring 16 is not completely transparent, and if the area of the orthographic projection of the transparent wiring 16 on the base 11 becomes small, a light-shielding area of the transparent wiring 16 will be small, which may help to increase the light transmittance of the camera region S and be beneficial to the shooting by the camera under the screen.

The forgoing descriptions are only specific implementations of the present disclosure, but the protection scope of the present disclosure is not limited thereto. Any changes or replacements that a person skilled in the art could readily conceive of within the technical scope disclosed in the present disclosure shall be included in the protection scope of the present disclosure. Therefore, the protection scope of the present disclosure shall be subject to the protection scope of the claims.

What is claimed is:

1. A display panel having an active area, the active area having a camera region, and the display panel comprising:
   a base;
   an insulating layer disposed on the base; the insulating layer having a plurality of first grooves located in the camera region, and an included angle between a groove wall of a first groove and a surface on which an opening of the first groove is located being less than 90 degrees; and
   a plurality of transparent wirings disposed on groove walls of the plurality of first grooves;
   on a plane perpendicular to the base and an extending direction of the first groove, a cross-sectional shape of the first groove is an inverted trapezoid or a triangle;
   wherein among the plurality of first grooves, cross-sectional shapes of a part of first grooves are inverted trapezoids, and cross-sectional shapes of another part of first grooves are triangles.

2. The display panel according to claim 1, wherein the included angle between the groove wall of the first groove and the surface on which the opening of the first groove is located is in a range of 20 to 80 degrees, inclusive.

3. The display panel according to claim 1, further comprising gate lines, and an extending direction of the first groove being parallel with an extending direction of the gate lines.

4. The display panel according to claim 1, further comprising data lines, and an extending direction of the first groove being parallel with an extending direction of the data lines.

5. The display panel according to claim 1, further comprising first light-emitting devices located in the camera region, wherein
the groove wall of the first groove is disposed under each line of first light-emitting devices parallel with an extending direction of the first groove.

6. The display panel according to claim 5, wherein lines of first light-emitting devices parallel with the extending direction of the first groove are in a one-to-one correspondence with the groove walls of the first grooves.

7. The display panel according to claim 1, wherein the plurality of transparent wirings are made of indium tin oxide.

8. The display panel according to claim 1, wherein the insulating layer is a first planarization layer; and
the display panel further comprises a second planarization layer disposed on the first planarization layer.

9. The display panel according to claim 8, further comprising first light-emitting devices disposed on the second planarization layer, and a first anode of a first light-emitting device passing through a first through hole in the second planarization layer to be electrically connected to a transparent wiring.

10. The display panel according to claim 1, wherein the insulating layer is an interlayer insulating layer; and
the display panel further comprises a first planarization layer, and the first planarization layer is disposed on the interlayer insulating layer.

11. The display panel according to claim 10, further comprising first light-emitting devices disposed on the first planarization layer, and a first anode of a first light-emitting device passing through a second through hole in the first planarization layer to be electrically connected to a transparent wiring.

12. The display panel according to claim 11, further comprising driving circuits located in the active area and outside the camera region; and a part of driving circuits being electrically connected to first anodes of the first light-emitting devices through the plurality of transparent wirings.

13. The display panel according to claim 12, further comprising second light-emitting devices located in the active area and outside the camera region, and disposed on the first planarization layer; and a second anode of a second light-emitting device passing through a third through hole in the first planarization layer to be electrically connected to a driving circuit.

14. The display panel according to claim 12, wherein each driving circuit includes a gate, and the gate is disposed on the interlayer insulating layer.

15. The display panel according to claim 12, wherein each driving circuit includes an active pattern, and the active pattern is disposed on the interlayer insulating layer.

16. The display panel according to claim 12, wherein each driving circuit includes a source-drain electrode layer, and the source-drain electrode layer is disposed on the interlayer insulating layer.

17. An electronic apparatus, comprising the display panel according to claim 1.

* * * * *